(12) United States Patent
Epstein et al.

(10) Patent No.: US 6,378,321 B1
(45) Date of Patent: Apr. 30, 2002

(54) SEMICONDUCTOR-BASED OPTICAL REFRIGERATOR

(75) Inventors: Richard I. Epstein, Santa Fe, NM (US); Bradley C. Edwards, Nekoosa, WI (US); Mansoor Sheik-Bahae, Albuquerque, NM (US)

(73) Assignee: The Regents of the University of California, Los Alamos, NM (US)

(*) Notice: Subject to any disclaimer, the term of this patent is extended or adjusted under 35 U.S.C. 154(b) by 0 days.

(21) Appl. No.: 09/798,339

(22) Filed: Mar. 2, 2001

(51) Int. Cl.[7] .............................. F25B 21/00; F25D 23/00
(52) U.S. Cl. ........................... 62/264; 62/3.1; 62/259.2
(58) Field of Search ........................ 62/3.1, 264, 259.2

(56) References Cited

U.S. PATENT DOCUMENTS 5,447,032 A * 9/1995 Epstein et al. ................ 62/3.1
5,615,558 A    4/1997 Cornell et al. ................ 62/56
6,041,610 A * 3/2000 Edwards et al. .............. 62/264

OTHER PUBLICATIONS

Gauck et al "External Radiative Quantum Efficieny of 96% from a GaAs/GaInP heterostructure" Applied Physics 143–147 (1997).*

E. Finkeiben, M. Potemski, and P. Wyder, L. Vina, G. Weimann, "Cooling of a semiconductor by luninescence up–conversion," Applied Physics Letters, vol., 75, No. 9, pp. 1258–12160, Aug. 30, 1999.

* cited by examiner

Primary Examiner—William C. Doerrler
(74) Attorney, Agent, or Firm—Milton D. Wyrick (57) ABSTRACT

Optical refrigerators using semiconductor material as a cooling medium, with layers of material in close proximity to the cooling medium that carries away heat from the cooling material and preventing radiation trapping. In addition to the use of semiconducting material, the invention can be used with ytterbium-doped glass optical refrigerators.

35 Claims, 8 Drawing Sheets

SEMICONDUCTOR-BASED OPTICAL REFRIGERATOR

The present invention generally relates to optical refrigerators, and, more particularly, to optical refrigerators using semiconductor materials to achieve the optical cooling. This invention was made with Government support under Contract No. W-7405-ENG-36 awarded by the U.S. Department of Energy. The Government has certain rights in the invention.

Optical refrigerators are solid-state devices that produce cooling by the interaction of substantially monochromatic light with selected materials. Earlier examples of this technology employed ytterbium-doped and thulium-doped glass and crystals to provide this optical cooling. Others have used laser-dye solutions. However the efficiency and operating temperature of these devices limited their application. Recently, researchers have explored the possibility of basing optical refrigerators on semiconductor materials.

Semiconductor-based optical refrigerators rely on the excitation of sub-thermal electron hole pairs. To accomplish this, a laser is tuned to a wavelength just below the edge of the bandgap, known as the Urbach tail, of the semiconductor, exciting these electron hole pairs. In only approximately $10^{-12}$ seconds, the excited free carriers thermally equilibrated by absorbing phonons, thereby cooling the semiconductor. Then, in approximately $10^{-9}$ seconds, the excited free carriers recombine, and emit photons of higher energy than the photons received from the laser. Thus, the escaping fluorescent photons remove both the pump photon energy and the energy of the absorbed phonons. This re-emission of photons with higher energies than of the absorbed photons is called anti-Stokes fluorescence. The beneficial net result of this process is the removal of heat from the material.

In fact, semiconductor materials offer numerous advantages over the earlier rare-earth-based optical refrigerators. First, semiconductor materials interact with laser radiation much better than does ytterbium-doped glasses or crystals. Due to this fact, the semiconductor materials can be much more compact, less than a millionth of the active mass of ytterbium-based devices. Second, semiconductor fabrication technology is quite mature, allowing high-purity devices to be fabricated that exhibit very little parasitic heating. This low parasitic heating may allow a semiconductor-based optical refrigerator to operate at lower temperatures than ytterbium-based devices. Semiconductor-based devices could operate at temperatures as low as 10° Kelvin. Third, semiconductor-based devices can be mass-produced at much lower cost than the ytterbium-based devices. Another potential benefit of semiconductor-based optical refrigerators is that the pumping laser diode could be located on the same substrate as the refrigerator, further increasing the compactness and lowering the cost of semiconductor-based optical refrigerators.

However, with all the potential benefits of semiconductor-based optical refrigerators, there has been one significant technological difficulty that has prevented them from being realized. This difficulty relates to the fact that semiconductor materials generally have large indices of refraction that prevents the re-emitted fluorescent light from escaping quickly. Experimentation has shown that the interaction of the laser light with the semiconductor material does locally cool the material. However, most of the fluorescent light leaving the interaction region is internally reflected at the outer boundary of the semiconductor material because of its large index of refraction and is subsequently reabsorbed in the semiconductor. This action by the semiconductor material is termed "radiation trapping."

The repeated absorption, fluorescence and reabsorption heat the semiconductor material and overwhelm the optical refrigeration effect. Semiconductor materials have not yet shown net cooling, where the overall temperature of the material exhibits a net temperature drop.

The present invention overcomes this problem with semiconductor-based optical refrigerators, allowing efficient optical refrigerators to be made using semiconductor materials. The invention accomplishes this with a novel arrangement of materials that facilitates emission of the fluorescence from the semiconductor material in an efficient manner.

It is therefore an object of this invention to provide an optical refrigerator based on a semiconductor material.

It is another object of the present invention to provide a semiconductor-based optical refrigerator that efficiently utilizes the input laser energy.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, a semiconductor based optical refrigerator cooled by optical radiation from a diode laser comprises a cooling layer having a first and second end, with the first end in optical contact with the optical radiation for producing fluorescent photons in response to excitation by the optical radiation, the cooling layer defining first and second faces, with a first passivating layer having first and second faces, the first face in contact with the first face of the cooling layer for carrying fluorescent photons away from the cooling layer, and the second face in contact with a device to be cooled. A second passivating layer having first and second faces, has the first face in contact with the second face of the cooling layer for carrying fluorescent photons away from the cooling layer. An absorbing layer is spaced apart from the second face of the passivating layer for receiving the fluorescent photons from the second optical conduction layer and producing thermal phonons. A heat sink is in contact with the absorbing layer for dissipating heat from the thermal phonons.

In another aspect of the present invention and in accordance with its purposes and objectives, a semiconductor based optical refrigerator cooled by optical radiation from a diode laser comprises a cooling layer having a first and second end, with the first end in optical contact with the optical radiation for producing fluorescent photons in response to excitation by the optical radiation, the cooling layer defining first and second faces, and a first passivating layer having first and second faces, the first face in contact with the first face of the cooling layer for carrying fluorescent photons away from the cooling layer, and the second face in contact with a device to be cooled. A second passivating layer having first and second faces, with the first face in contact with the second face of the cooling layer for carrying fluorescent photons away from the cooling layer. An absorbing layer is spaced apart from the second face of the passivating layer for receiving the fluorescent photons from said the optical conduction layer and producing thermal phonons. An enclosure encloses and is in close proximity to the device to be cooled, the cooling layer, the first and second passivating layer, and the absorbing layer. The enclosure is made of a layer of anti-reflective material on a layer of absorbing material on a layer of gold on a heat sink and defining an aperture though said heat sink and through the layer of gold, the layer of absorbing material, and the layer of anti-reflective material. Wherein a laser beam emitted through the aperture cools the cooling layer providing cooling of the device to be cooled.

In yet another aspect of the present invention and in accordance with its purposes and objectives, an optical refrigerator using ytterbium-doped glass having first and second faces as a cooling layer comprises first and second dielectric mirrors deposited onto the first and second faces of the ytterbium-doped glass with a device to be cooled deposited onto the first dielectric mirror. An enclosure encloses and is in close proximity to the ytterbium-doped glass, the first and second dielectric mirrors, and the device to be cooled, the enclosure being made of a layer of anti-reflective material on a layer of absorbing material on a layer of gold on a heat sink, and defining an aperture though the heat sink, the layer of gold, the layer of absorbing material, and the layer of anti-reflective material. Wherein a laser beam emitted through the aperture cools the cooling layer providing cooling of the device to be cooled.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

The present invention allows semiconductor materials to be use effectively in optical refrigeration applications. The invention can be understood most easily through reference to the drawings.

Figure 1:
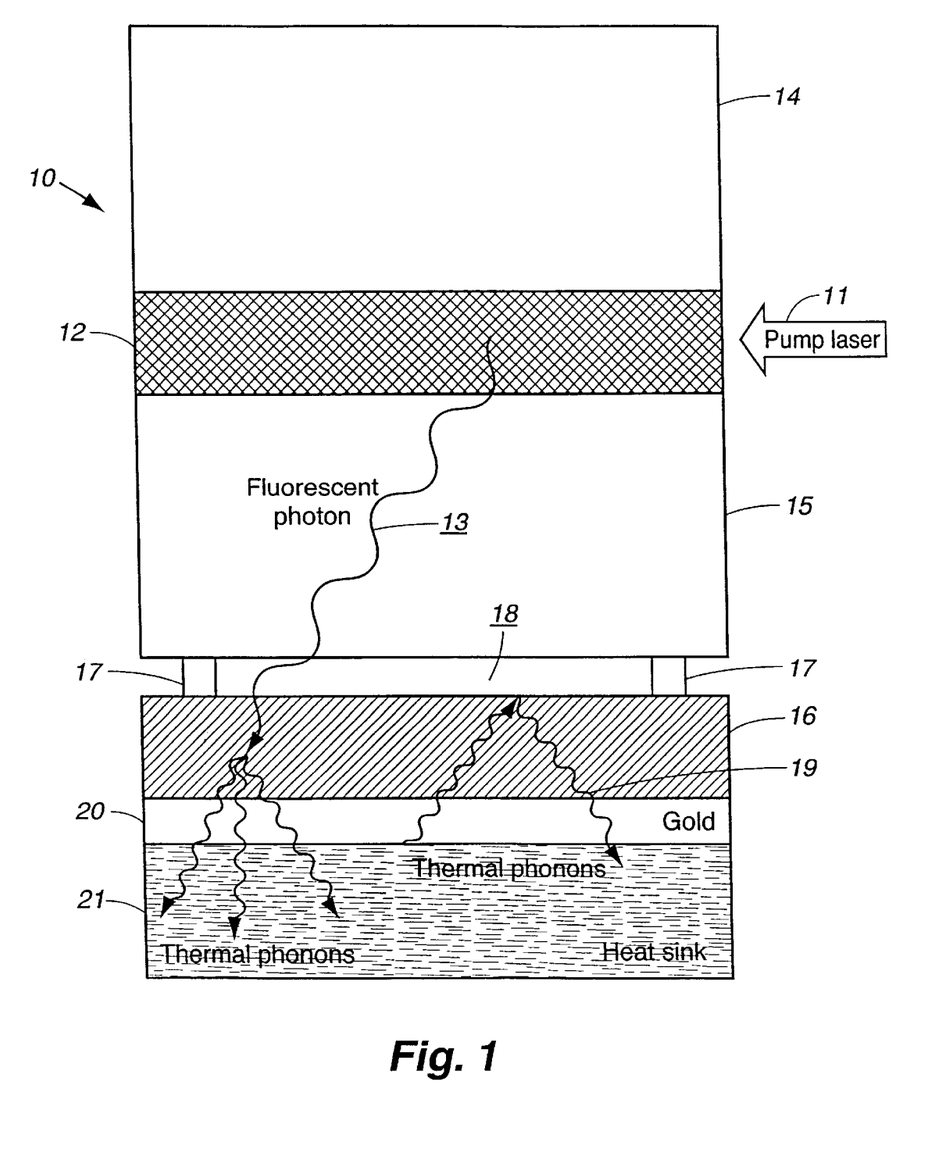
FIG. 1 is a schematical cross-section view of the action of the radiation transmission and thermal barrier of the present invention.

In FIG. 1, a schematical cross-section illustration of the primary process involved in the present invention labeled in FIG. 1 as cooling elements 10. As seen, a pump laser radiation 11 enters cooling layer 12 and, upon interacting with electrons in cooling layer 12, causes the emission of fluorescent photons 13. Passivating layers 14, 15 form a planar wave-guide that confines pump laser radiation 11 to cooling layer 12 so that the effect of pump laser radiation 11 can be optimized. Cooling layer 12 can be any appropriate direct band-gap semiconductor material. Examples of such materials include gallium arsenide (GaAs) and gallium indium aresenide (GaInAs). Passivating layer 15 also can be any appropriate semiconductor. Examples include gallium indium phosphide (GaInP) and gallium phosphide (GaP).

Spaced apart from passivating layer 15 is absorbing layer 16. Absorbing layer 16 is comprised of an appropriately matched semiconductor such as germanium (Ge), and is spaced apart by spacers 17, which maintain a spacing that is much less than the wavelength of fluorescent photons 13. A radiation transmission-thermal barrier 18 having a thickness of 100 nm or less will satisfy this requirement for most applications. Spacers 17 can be made of any appropriate material that is capable of separating passivating layer 15 from absorbing layer 16 by the appropriate width of radiation transmission-thermal barrier 18.

When pump laser radiation 11 of the appropriate energy enters cooling layer 12 and excites free carriers in cooling layer 12, the free carriers quickly equilibrate by absorbing phonons, thereby lowering the temperature of cooling layer 12. Approximately $10^{-9}$ seconds later, the excited carriers recombine and emit fluorescent photons 13 having higher energy than those from pump laser radiation 11. This remission of fluorescent photons 13 having higher energies than that possessed by pump laser radiation 11 is known as "anti-Stokes fluorescence." The net result of this process is the removal of heat from cooling layer 12. Efficiently removing this heat from cooling layer 12 is the main thrust of the present invention.

It is important to the present invention that the thickness of cooling layer 12 be sufficiently thin so that only a small fraction of fluorescent photons 13 are absorbed when passing vertically through cooling layer 12. Downwardly moving fluorescent photons 13 encounter radiation transmission-thermal barrier 18. As the name of radiation transmission-thermal barrier 18 implies, it is a region or material that is optically highly conductive, while having little or no thermal conduction.

Although FIG. 1 shows spacers 17 separating layer 15 from absorbing layer 16 forming a vacuum gap, radiation transmission-thermal barrier 18 could also be a material that is nearly index matched to passivating layer 15 and to absorbing layer 16, and having small thermal conductivity. Examples of such a material include highly strained super lattices and amorphous aluminum dioxide. The strain-induced lack of longitudinal phonon coupling in such materials has been shown to lower their coefficients of thermal conduction. When using such materials as radiation transmission-thermal barrier 18, the thickness of radiation transmission-thermal barrier 18 is not as critical as when it is a vacuum gap, and can be used as an optimization parameter.

As radiation trapping in a conventional semiconductor optical refrigerator is predominantly a result of total internal reflection, radiation transmission-thermal barrier 18 as a vacuum gap, as shown in FIG. 1, facilitates fluorescent photon 13 tunneling by way of frustrated total internal reflection, while providing virtually no thermal conduction across radiation transmission-thermal barrier 18. As previously stated, the thickness of radiation transmission-thermal barrier 18 is chosen so that fluorescent photons 13 can propagate from cooling layer 12 and passivating layer 15 into absorbing layer 16 with little reflection. A thickness of 100 nm or less when radiation transmission-thermal barrier 18 is a vacuum gap will be appropriate for most applications.

With radiation transmission-thermal barrier 18 being either a vacuum gap or a solid material as described above, fluorescent photons 13 propagate across radiation transmission-thermal barrier 18 and enter absorbing layer 16. Absorbing layer 16 absorbs the incoming fluorescent photons 13 within the length of a few microns and converts fluorescent photons 13 into heat in the form of thermal phonons 19.

Absorbing layer 16 is deposited onto gold layer 20, which is deposited onto heat sink 21. Thus, thermal phonons 19 are carried away by gold layer 20 and heat sink 21. Any thermal phonons 19 that move upward toward cooling layer 12 will be halted by radiation transmission-thermal barrier 18 either because of the vacuum space of radiation transmission-thermal barrier 18, or the lack of thermal conductivity of a material used as such. It should be noted that with a vacuum space for radiation transmission-thermal barrier 18, spacers 17 that maintain the spacing between passivating layer 15 and absorbing layer 16 cover a miniscule area and do not enhance significantly any thermal contact across radiation transmission-thermal barrier 18.

It is to be noted also that with absorbing layer 16 being deposited on gold layer 20 further limits any thermal photons from reaching cooling layer 12. This is because gold has an emissivity for thermal radiation of approximately 2%, and absorbing layer 16 nearly is transparent to thermal radiation. The net effect of this configuration is the amount of thermal photons 19 impinging on cooling layer 12 from heat sink 21 is reduced by approximately 98%.

Figure 2:
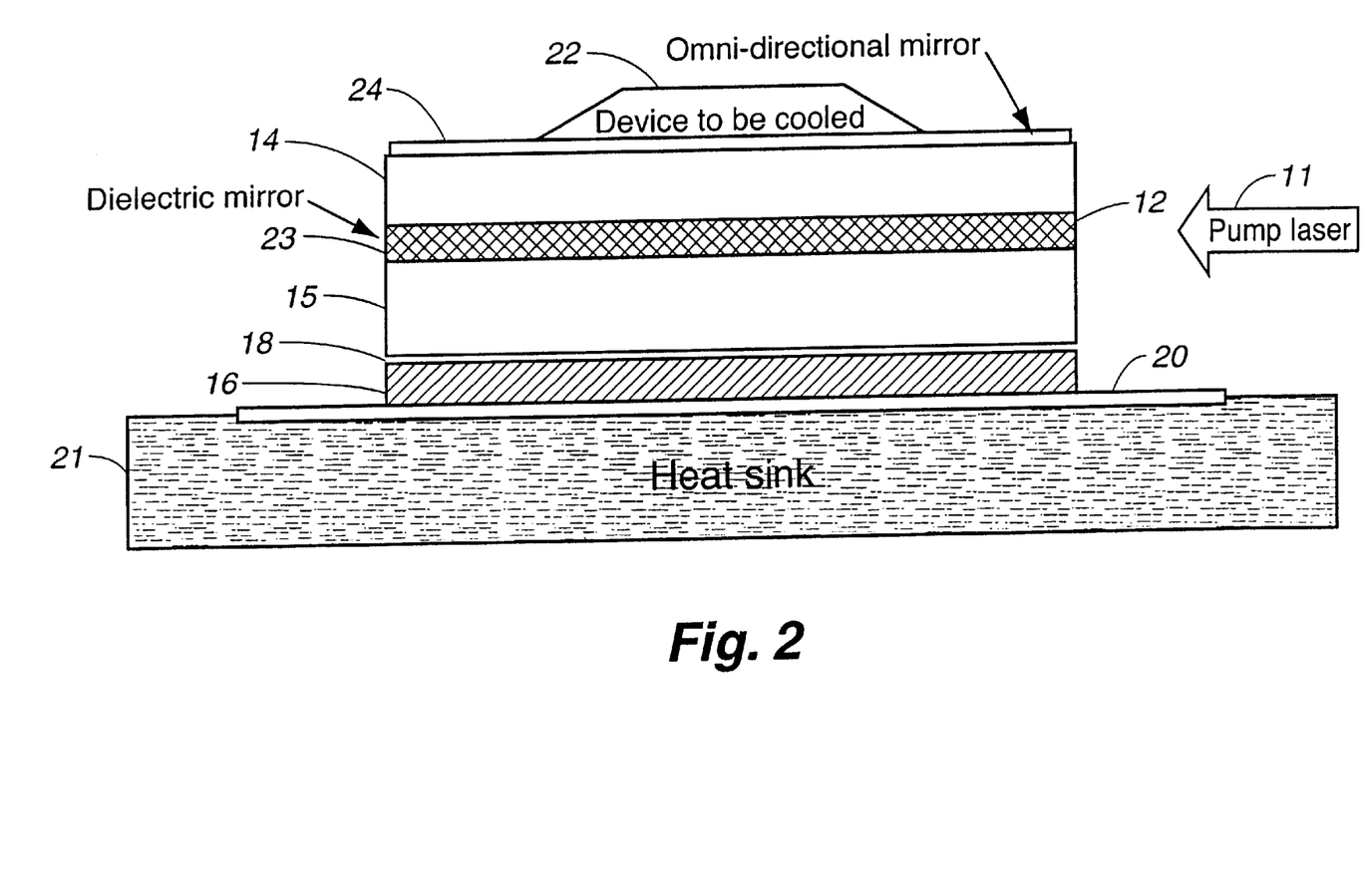
FIG. 2 is a schematical cross-section illustration of one embodiment of the present invention in which the components of the invention are shown along with a device to be cooled.

A more complete illustration of the present invention is illustrated in FIG. 2. It is to be noted that the numerals in FIG. 2 for the same elements illustrated in FIG. 1 are the same. As seen in side view, cooling layer 12 deposited between two passivating layer layers 14, 15, and is approximately 1 micron thick in most cases. The dimensions of the device can be several millimeters in order to accommodate device to be cooled 22, which rests on omni-directional mirror 24. Cooling layer 12 again is side pumped with pump laser radiation 11 with light of the appropriate wavelength. Cooling layer 12 being between passivating layers 14, 15 forms a planar waveguide, confining pump laser radiation 11 to cooling layer 12. Dielectric mirror 23 is deposited onto the edge of cooling layer 12 to reflect pump laser radiation 11 back through cooling layer 12. This assures that light from pump laser radiation 11 almost fully is absorbed.

As in FIG. 1, absorbing layer 16 is separated from passivating layer 15 by radiation transmission-thermal barrier gap 18. In contact with by radiation transmission-thermal barrier gap 18 is gold layer 20, which is deposited onto heat sink 21.

Any fluorescent photons 13 (FIG. 1) that move in an upward direction will strike omni-directional mirror 24, which is attached between passivating layer 14 and device to be cooled 22. This causes most of the upwardly moving fluorescent photon 13 to be reflected back through passivating layer 14, cooling layer 12, passivating layer 15, and radiation transmission-thermal barrier 18, to be absorbed in absorbing layer 16.

Figure 3:
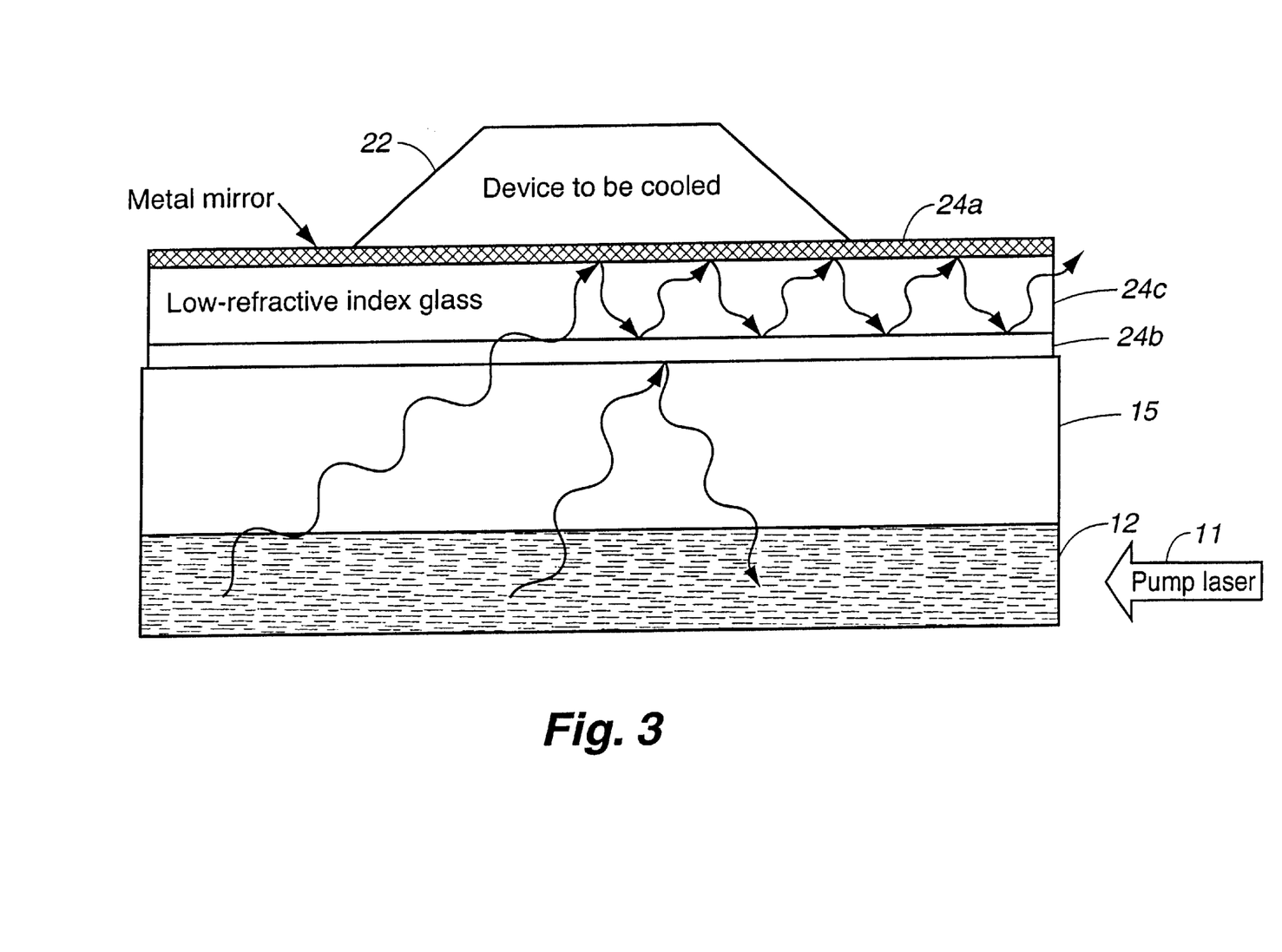
FIG. 3 is a schematical cross-section view of one embodiment of the omni-directional reflector used in the present invention.

One embodiment of the composition of omni-directional mirror 24 is illustrated in greater detail in FIG. 3. As shown, omni-directional mirror 24 is made up of metal mirror 24a that is in contact with device to be cooled 22. Metal mirror 24a and broadband wide-angle dielectric mirror 24b surround low-refractive index glass 24c. Upwardly moving fluorescent photons 13 first encounter broadband wide-angle dielectric mirror 24b where most are reflected back into passivating layer 14 to traverse eventually into absorbing layer 16 (FIG. 2).

Those fluorescent photons 13 that pass through broadband wide-angle dielectric mirror 24b enter low-refractive index glass 24c and are reflected back by metal mirror 24a. Metal mirror 24a can be made of any highly reflective and highly conductive metal, such as silver, and serves to shield device to be cooled 22 from the radiation. Some fluorescent photons 13 are confined between metal mirror 24a and broad-band wide-angle dielectric mirror 24b until multiple reflections carry them out of low-refractive index glass 24c.

Figure 4:
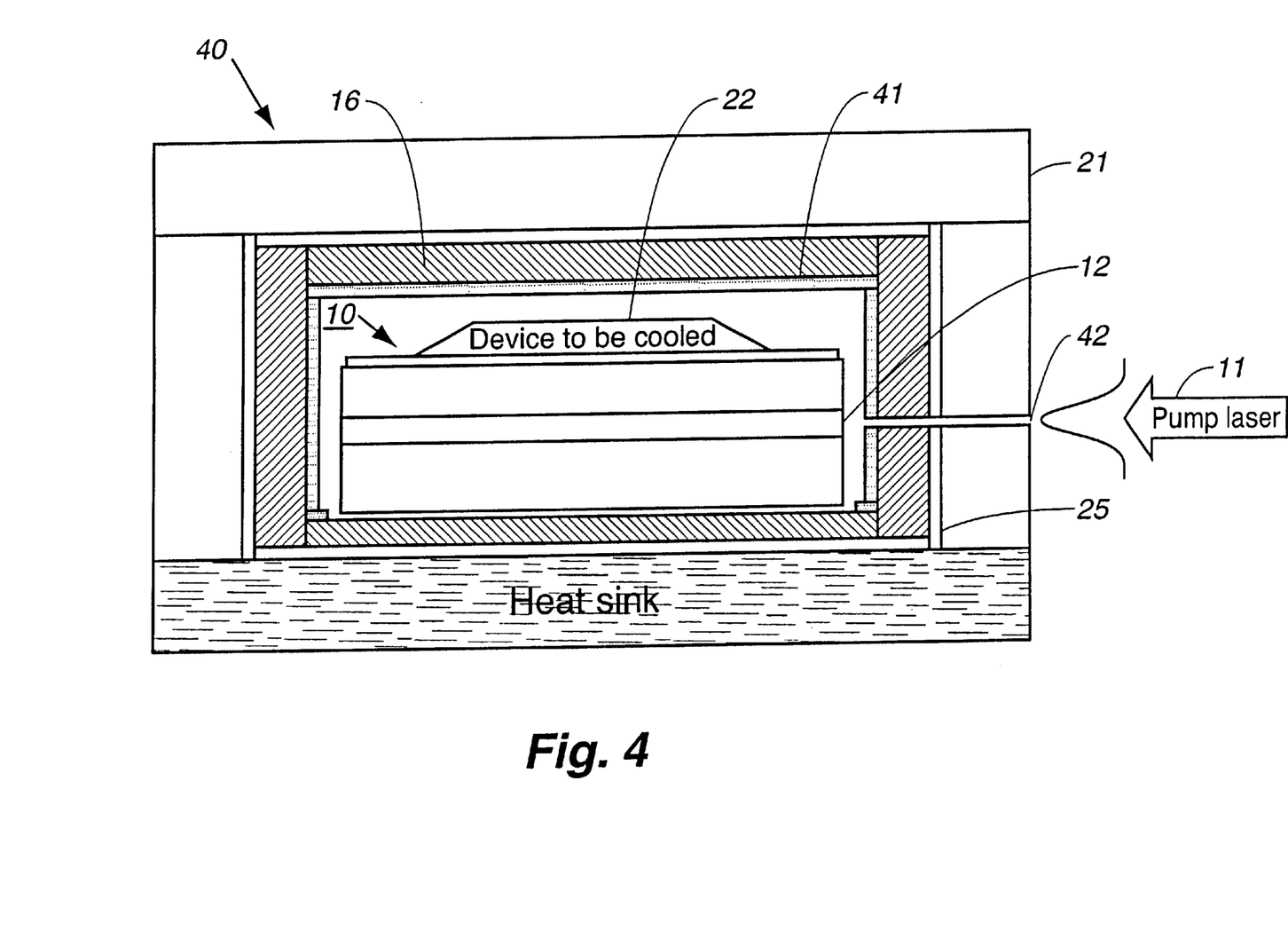
FIG. 4 is a schematical cross-section view of one embodiment of the complete present invention showing the high-absorption low-thermal-emissivity shielding on the vacuum chamber.

A complete embodiment of the present invention is illustrated in FIG. 4. Again, the numbering of components in this FIG. 4 is the same for components shown and described in previous figures. This embodiment adds elements that serve as an additional mechanism for limiting the thermal radiation that could impinge on cooling layer 12, and on device to be cooled 22. As illustrated, cooling elements 10 are surrounded on all sides by enclosure that has heat sink 21, which is coated with gold layer 25, absorbing layer 16 and anti-reflecting layer 41. Anti-reflecting layer 41 is a material tuned to the wavelength of fluorescent photons 13 (FIG. 1). An appropriate material for anti-reflecting layer 41 is layers of titanium dioxide and silicon dioxide, although other materials could be selected for a specific application as long as they meet the above wavelength requirement. The low thermal emissivity of gold layer 25 and absorbing layer 16 reduces the thermal emission that can impinge upon cooling elements 10 and device to be cooled 22. Enclosure 40 defines an aperture 42 for passage of pump laser radiation 11.

Figure 5:
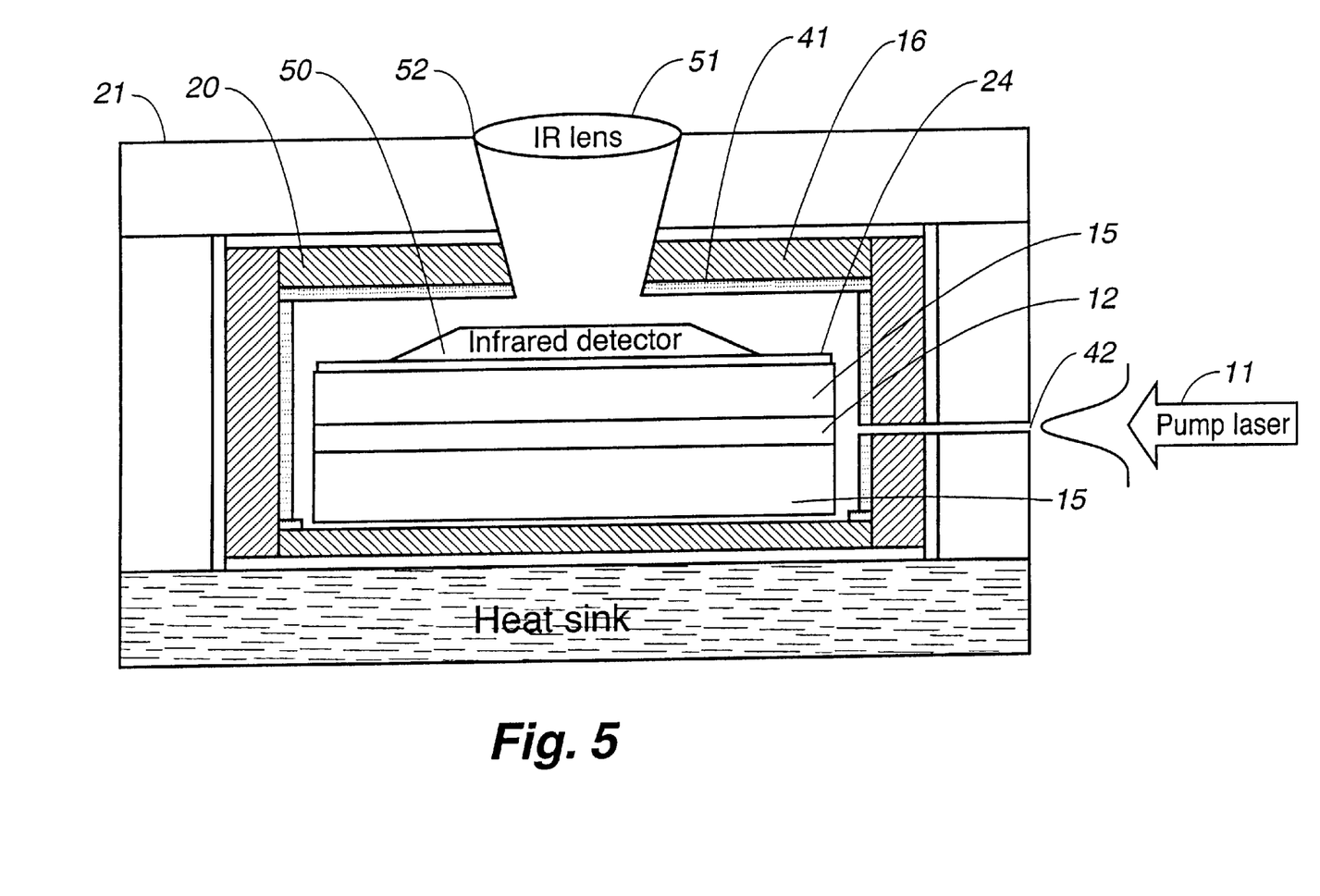
FIG. 5 is a schematical cross-section view of an embodiment of the present invention useful in the cooling of infrared detectors.

FIG. 5 illustrates another embodiment of the present useful for the cooling of infrared detectors. In this embodiment, infrared detector 50 is device to be cooled 22 (FIG. 2). Infrared lens 51 is mounted on heat sink 21 to focus infrared radiation onto infrared detector 50 through aperture 52 in heat sink 21. The only modifications to the embodiment described in FIG. 5 to enable infrared detector cooling are the creation of aperture 52 and the insertion of infrared lens 51.

Figure 6:
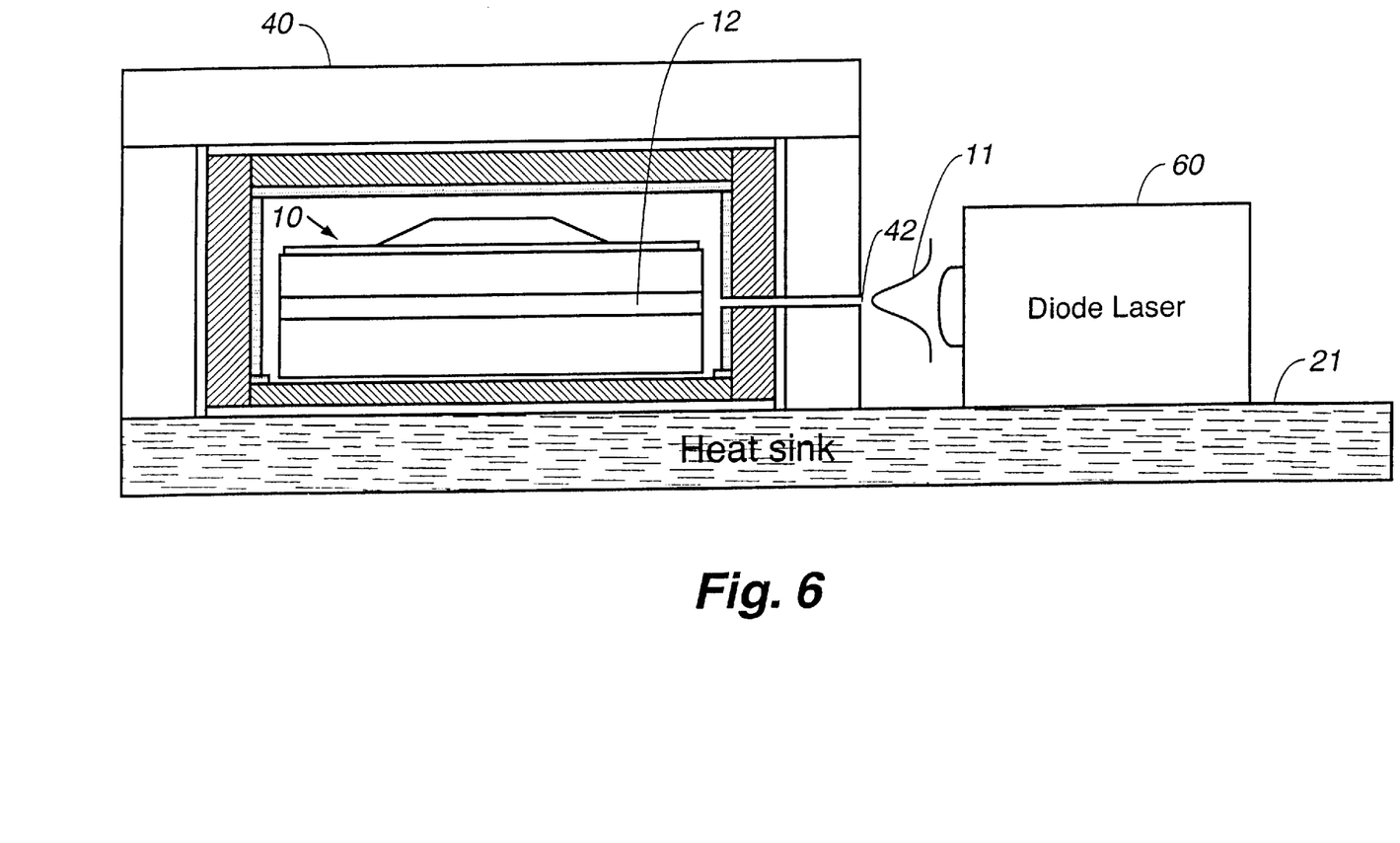
FIG. 6 is a schematical cross-section view of an embodiment of the present invention with a laser incorporated on the same substrate as the present invention.

An important advantage of the present invention is illustrated in FIG. 6, which shows how laser diode 60 can be incorporated onto the same substrate as enclosure 40 and cooling elements 10, and is properly aligned so that pump laser radiation 11 will enter cooling elements 10 through aperture 42 to impinge upon cooling layer 12. As shown, heat sink 21 extends to lie under laser diode 60 to remove any heat generated by laser diode 60.

Figure 7:
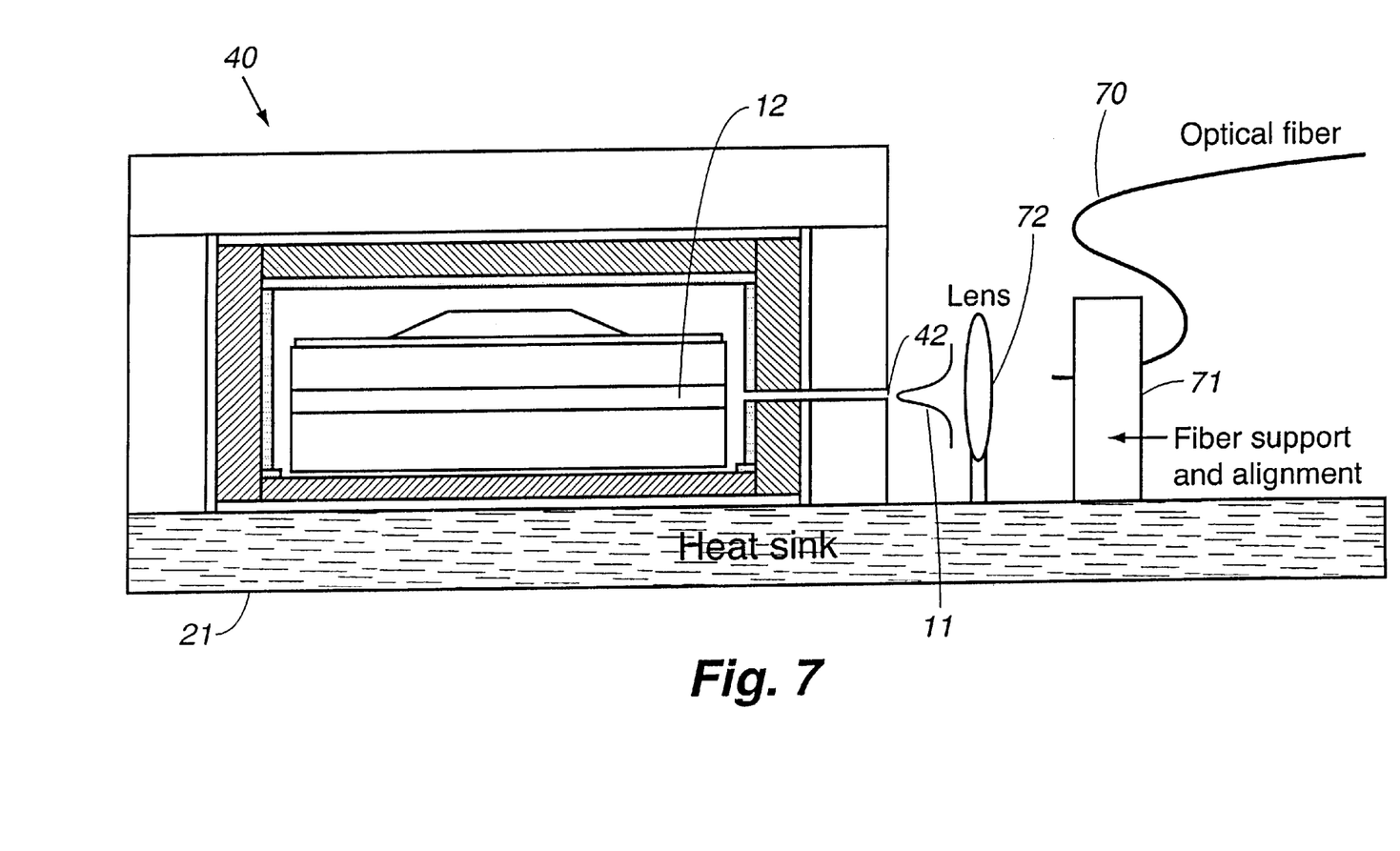
FIG. 7 is a schematical cross-section view of an embodiment of the present invention with a laser located remotely from the present invention and the light brought to the present invention by an optical fiber.

For some applications, it may be advantageous to locate laser diode 60 (FIG. 6) at a distant location. As shown in FIG. 7, optical fiber 70 would carry pump laser radiation 11 from laser diode 60 (FIG. 6). Fiber support and alignment 71 maintains optical fiber 70 in precise alignment with lens 72 so that pump laser radiation 11 will properly enter aperture 42 and impinge upon cooling layer 12.

Figure 8:
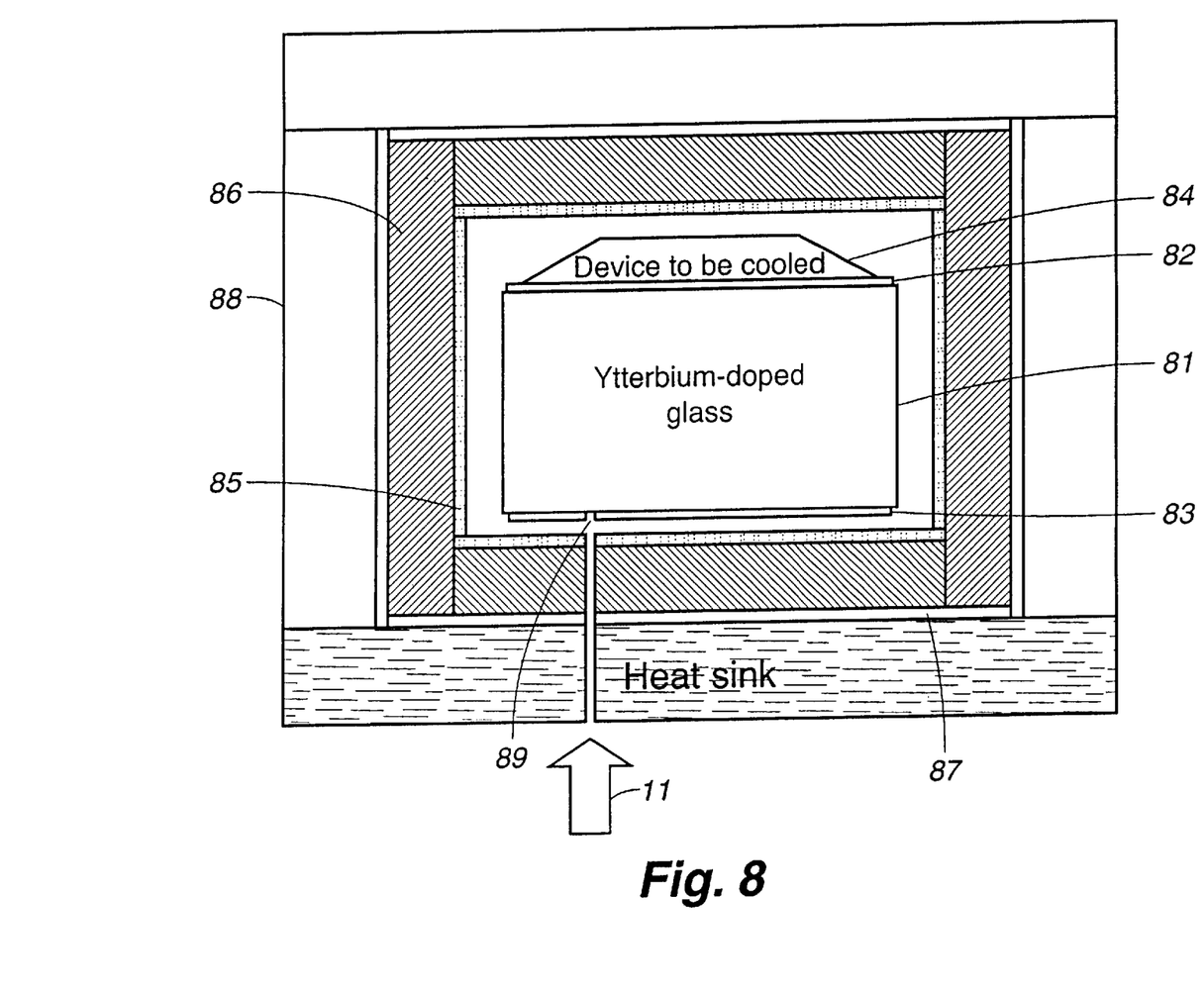
FIG. 8 is a schematical cross-section view of an embodiment of the present invention applied to ytterbium-based optical refrigerators.

The principles of the present invention can also be applied to the prior art ytterbium based optical refrigerators to improve their performance. One manner in which this can be accomplished is illustrated in FIG. 8, where ytterbium-doped glass layer 81 has dielectric mirrors 82, 83 on its faces with device to be cooled 84 on dielectric mirror 82. As with the previously described semiconductor optical refrigerator embodiments, this assembly is surrounded by and in close proximity to anti-reflective coating 85, absorbing layer 86, gold layer 87 and heat sink 88. Aperture 89 through dielectric mirror 83, anti-reflective coating 85, absorbing layer 86, gold layer 87 and heat sink 88, allows passage of pump laser radiation 11 to have access to ytterbium-doped glass layer 81.

The operation of this embodiment of the present invention is similar to the previously described semiconductor embodiments. Pump laser radiation 11 impinges on ytterbium-doped glass layer 81 through aperture 89 and creates fluorescent photons 13 (FIG. 1). As before, these fluorescent photons 13 leave ytterbium-doped glass layer 81 and are passed through anti-reflective coating 85, to absorbing layer 86, finally to be passed through gold layer 87 to be dissipated in heat sink 88. This allows ytterbium-doped glass layer 81 to achieve more efficient cooling of device to be cooled 84. The materials to be used in the layers of this embodiment of the present invention can be the same as those for the previous embodiments.

The foregoing description of the embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A semiconductor based optical refrigerator cooled by optical radiation from a diode laser comprising:
   a cooling layer having a first and second end, with said first end in optical contact with said optical radiation for producing fluorescent photons in response to excitation by said optical radiation, said cooling layer defining first and second faces;
   a first passivating layer having first and second faces, said first face in contact with said first face of said cooling layer for carrying fluorescent photons away from said cooling layer, and said second face in contact with a device to be cooled;
   a second passivating layer having first and second faces, said first face in contact with said second face of said cooling layer for carrying fluorescent photons away from said cooling layer;
   an absorbing layer spaced apart from said second face of said second passivating layer for receiving said fluorescent photons from said second passivating layer and producing thermal phonons; and
   a heat sink in contact with said absorbing layer for dissipating heat from said thermal phonons.

2. The optical refrigerator as described in claim 1, further comprising a first dielectric mirror in contact with said second face of said first passivating layer for reflecting said fluorescent photons back through said first passivating layer.

3. The optical refrigerator as described in claim 1, further comprising a second dielectric mirror attached to said second end of said cooling layer.

4. The optical refrigerator as described in claim 1, wherein said cooling layer comprises gallium arsenide.

5. The optical refrigerator as described in claim 1, wherein said cooling layer comprises gallium indium arsenide.

6. The optical refrigerator as described in claim 1, wherein said first passivating layer comprises gallium indium phosphide.

7. The optical refrigerator as described in claim 6, wherein said second passivating layer comprises gallium indium phosphide.

8. The optical refrigerator as described in claim 6, wherein said second passivating layer comprises gallium phosphide.

9. The optical refrigerator as described in claim 1, wherein said first passivating layer comprises gallium phosphide.

10. The optical refrigerator as described in claim 1, wherein said second passivating layer comprises gallium phosphide.

11. The optical refrigerator as described in claim 1, wherein said second passivating layer comprises gallium indium arsenide.

12. The optical refrigerator as described in claim 2, wherein said first dielectric mirror comprises a broad-band wide-angle dielectric mirror in contact with said second face of said first passivating layer, a low-refractive index glass over said broad-band wide-angle dielectric mirror, and a metal mirror over said low-refractive index glass for trapping fluorescent photons in said refractive index glass until said fluorescent photons exit said refractive index glass.

13. The optical refrigerator as described in claim 1, wherein said absorbing layer comprises germanium.

14. The optical refrigerator as described in claim 1, further comprising a layer of gold deposited between said absorbing layer and said heat sink.

15. The optical refrigerator as described in claim 1, wherein said second passivating layer is spaced apart from said absorbing layer by spacers.

16. The optical refrigerator as described in claim 1, wherein said second passivating layer is spaced apart from said absorbing layer by a layer of highly strained superlattice material.

17. The optical refrigerator as described in claim 1, wherein said second face of said second passivating layer is spaced apart from said absorbing layer by a layer of amorphous aluminum dioxide.

18. A semiconductor based optical refrigerator cooled by optical radiation from a diode laser comprising:
   a cooling layer having a first and second end, with said first end in optical contact with said optical radiation for producing fluorescent photons in response to excitation by said optical radiation, said cooling layer defining first and second faces;
   a first passivating layer having first and second faces, said first face in contact with said first face of said cooling layer for carrying fluorescent photons away from said cooling layer, and said second face in contact with a device to be cooled;
   a second passivating layer having first and second faces, said first face in contact with said second face of said cooling layer for carrying fluorescent photons away from said cooling layer;
   an absorbing layer spaced apart from said second face of said passivating layer for receiving said fluorescent photons from said second optical conduction layer and producing thermal phonons; and
   an enclosure enclosing and in close proximity to said device to be cooled, said cooling layer, said first and second passivating layer, and said absorbing layer, said enclosure being made of a layer of anti-reflective material on a layer of absorbing material on a layer of gold on a heat sink and defining an aperture though said heat sink, said layer of gold, said layer of absorbing material, and said layer of anti-reflective material;

wherein a laser beam emitted through said aperture cools said cooling layer providing cooling of said device to be cooled.

19. The optical refrigerator as described in claim 18, further comprising a first dielectric mirror in contact with said second face of said first passivating layer for reflecting said fluorescent photons back through said first passivating layer.

20. The optical refrigerator as described in claim 18, further comprising a second dielectric mirror attached to said second end of said cooling layer.

21. The optical refrigerator as described in claim 18, wherein said cooling layer comprises gallium arsenide.

22. The optical refrigerator as described in claim 18, wherein said cooling layer comprises gallium indium arsenide.

23. The optical refrigerator as described in claim 18, wherein said first passivating layer comprises gallium indium phosphide.

24. The optical refrigerator as described in claim 23, wherein said second passivating layer comprises gallium indium phosphide.

25. The optical refrigerator as described in claim 23, wherein said second passivating layer comprises gallium phosphide.

26. The optical refrigerator as described in claim 18, wherein said first passivating layer comprises gallium phosphide.

27. The optical refrigerator as described in claim 18, wherein said second passivating layer comprises gallium phosphide.

28. The optical refrigerator as described in claim 18, wherein said second passivating layer comprises gallium indium arsenide.

29. The optical refrigerator as described in claim 19, wherein said first dielectric mirror comprises a broad-band wide-angle dielectric mirror in contact with said second face of said first passivating layer, a low-refractive index glass over said broad-band wide-angle dielectric mirror, and a metal mirror over said low-refractive index glass for trapping fluorescent photons in said refractive index glass until said fluorescent photons exit said refractive index glass.

30. The optical refrigerator as described in claim 18, wherein said absorbing layer comprises germanium.

31. The optical refrigerator as described in claim 18, further comprising a layer of gold deposited between said absorbing layer and said heat sink.

32. The optical refrigerator as described in claim 18, wherein said second passivating layer is spaced apart from said absorbing layer by spacers.

33. The optical refrigerator as described in claim 18, wherein said second passivating layer is spaced apart from said absorbing layer by a layer of highly strained superlattice material.

34. The optical refrigerator as described in claim 18, wherein said second face of said second passivating layer is spaced apart from said absorbing layer by a layer of amorphous aluminum dioxide.

35. An optical refrigerator using ytterbium-doped glass having first and second faces as a cooling layer comprising:

first and second dielectric mirrors deposited onto said first and second faces of said ytterbium-doped glass;

a device to be cooled deposited onto said first dielectric mirror;

an enclosure enclosing and in close proximity to said ytterbium-doped glass, said first and second dielectric mirrors, and said device to be cooled, said enclosure being made of a layer of anti-reflective material on a layer of absorbing material on a layer of gold on a heat sink and defining an aperture though said heat sink, said layer of gold, said layer of absorbing material, and said layer of anti-reflective material;

wherein a laser beam emitted through said aperture cools said ytterbium-doped glass providing cooling of said device to be cooled.

* * * * *